United States Patent
Doong

(10) Patent No.: US 7,405,585 B2
(45) Date of Patent: Jul. 29, 2008

(54) VERSATILE SEMICONDUCTOR TEST STRUCTURE ARRAY

(75) Inventor: Yih-Yuh Doong, Shin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/522,069

(22) Filed: Sep. 15, 2006

(65) Prior Publication Data

US 2007/0200587 A1   Aug. 30, 2007

Related U.S. Application Data

(60) Provisional application No. 60/773,757, filed on Feb. 14, 2006.

(51) Int. Cl.
  *G01R 31/02* (2006.01)
  *G01R 31/26* (2006.01)

(52) U.S. Cl. .................................... 324/763; 324/765

(58) Field of Classification Search ............... 324/158.1, 324/763, 767, 769–770; 365/201; 714/733–734
See application file for complete search history.

(56) References Cited

U.S. PATENT DOCUMENTS

| | | | | | |
|---|---|---|---|---|---|
| 4,961,053 | A | * | 10/1990 | Krug | 324/537 |
| 5,070,297 | A | * | 12/1991 | Kwon et al. | 324/754 |
| 5,241,266 | A | * | 8/1993 | Ahmad et al. | 714/733 |
| 5,389,556 | A | * | 2/1995 | Rostoker et al. | 438/17 |
| 5,446,395 | A | * | 8/1995 | Goto | 324/763 |
| 5,608,335 | A | * | 3/1997 | Tailliet | 324/763 |
| 5,648,661 | A | * | 7/1997 | Rostoker et al. | 257/48 |
| 5,654,588 | A | * | 8/1997 | Dasse et al. | 257/754 |
| 5,764,654 | A | * | 6/1998 | Ohba et al. | 714/724 |
| 5,838,163 | A | * | 11/1998 | Rostoker et al. | 324/763 |
| 5,841,961 | A | * | 11/1998 | Kozaru et al. | 714/5 |
| 6,286,116 | B1 | * | 9/2001 | Bhavsar | 714/720 |
| 6,323,664 | B1 | * | 11/2001 | Kim et al. | 324/754 |
| 6,539,324 | B2 | * | 3/2003 | Miyatake et al. | 702/117 |
| 6,781,899 | B2 | * | 8/2004 | Han et al. | 365/201 |
| 6,867,580 | B1 | * | 3/2005 | de Jong et al. | 324/158.1 |
| 7,071,487 | B2 | * | 7/2006 | Maruyama | 257/48 |
| 2003/0126525 | A1 | * | 7/2003 | Miyashita et al. | 714/718 |
| 2006/0048031 | A1 | * | 3/2006 | Aadsen et al. | 714/733 |

OTHER PUBLICATIONS

Doong, Kelvin Y.Y., et al., "Field-Configurable Test Structure Array (FC-TSA): Enabling design for monitor, model and manufacturability", IEEE Int'l Conference on Microelectronic Test Structures, Mar. 6-9, 2006.

* cited by examiner

*Primary Examiner*—Ha Nguyen
*Assistant Examiner*—Joshua Benitez
(74) *Attorney, Agent, or Firm*—K & L Gates LLP

(57) ABSTRACT

This invention discloses a semiconductor test structure array comprising a plurality of unit cells for containing devices under test (DUT) arranged in an addressable array, and an access-control circuitry within each unit cell for controlling accesses to one or more DUTs, wherein the access-control circuitry comprises at least four identical controlled transmission gates (CTGs), and a plurality of the access-control circuitries are isomorphic.

20 Claims, 5 Drawing Sheets

VERSATILE SEMICONDUCTOR TEST STRUCTURE ARRAY

CROSS REFERENCE

The present application claims the benefit of U.S. Provisional Application Ser. No. 60/773,757, which was filed on Feb. 14, 2006, and titled "Field Programmable Test Structure Array."

BACKGROUND

The present invention relates generally to integrated circuit (IC) designs, and, more particularly, to a test structure array that can accommodate various types of test structures.

In state-of-the-art Complementary Metal-Oxide-Semiconductor (CMOS) logic processes, variations of device electrical parameters resulting from the lithographic proximity, etching loading effect among the various pattern density area, chemical-mechanical polishing non-planarization, etc., are dominating and worsening the variability of circuit performance as well as degrading the product yield. In order to sustain circuit performances and product yields, foundries provide process characteristic related design rule sets, which are often called Recommended Rules (Rrules). The more complex the processes are, the more device and process parameters are needed to be characterized.

Traditionally, production monitoring test chips are placed in small scribe lines between product dies. But its limited space cannot accommodate large numbers of test devices. The space required for large number of test devices is only found on large test chips, usually processed on a single fab lot for characterization purposes. While using the test chips is useful, they provide no assistance for on-going production monitoring nor to help debug actual circuits that are not built onto the test chips.

Although the number of test devices is increasing, field size of photolithography is still unchanged at a limiting 33×26 mm². To compromise the limited photolithography field size and the need to characterize a large number of test devices, various test vehicle design methodologies adopting addressable array and multiplexed cell accesses have been proposed.

Individual test devices normally occupy a very small area. If placing them in an addressable array, i.e., a test device that forms a part of a unit cell of the array, then a large quantity of test devices can be accommodated in a two dimensional space, yet can still be addressed by a small number of addresses. Multiplexed cell accesses are for switching access to a larger number of test devices through a small number of input/output nodes, which are known as the 'probe pads' on a probe card.

However, as each test device has different connections, if a corresponding control circuit is also different from one unit cell to another, then designing a large array of unit cells containing various test devices will be a substantial endeavor and often not practical. Besides, additional parasitic resistance introduced by the multiplexing scheme can also prohibit many kinds of measurements due to excessive background leakage.

As such, there is a need for a multiplexed addressable test structure array with a common unit cell construction, which can minimize effects caused by parasitic resistance and non-linear characteristic of a multiplexing scheme.

SUMMARY

This invention discloses a semiconductor test structure array comprising a plurality of unit cells for containing devices under test (DUTs) arranged in an addressable array, and an access-control circuitry within each unit cell for controlling accesses to one or more DUTs, wherein the access-control circuitry comprises at least four identical controlled transmission gates (CTGs), and a plurality of the access-control circuitries are isomorphic.

The construction and method of operation of the invention, however, together with additional objectives and advantages thereof will be best understood from the following description of specific embodiments when read in connection with the accompanying drawings.

DESCRIPTION

The present disclosure provides a versatile test structure array having multiple addressable unit cells, which contain devices under test (DUTs), and are accessed through a multiplexing scheme.

Figure 1:
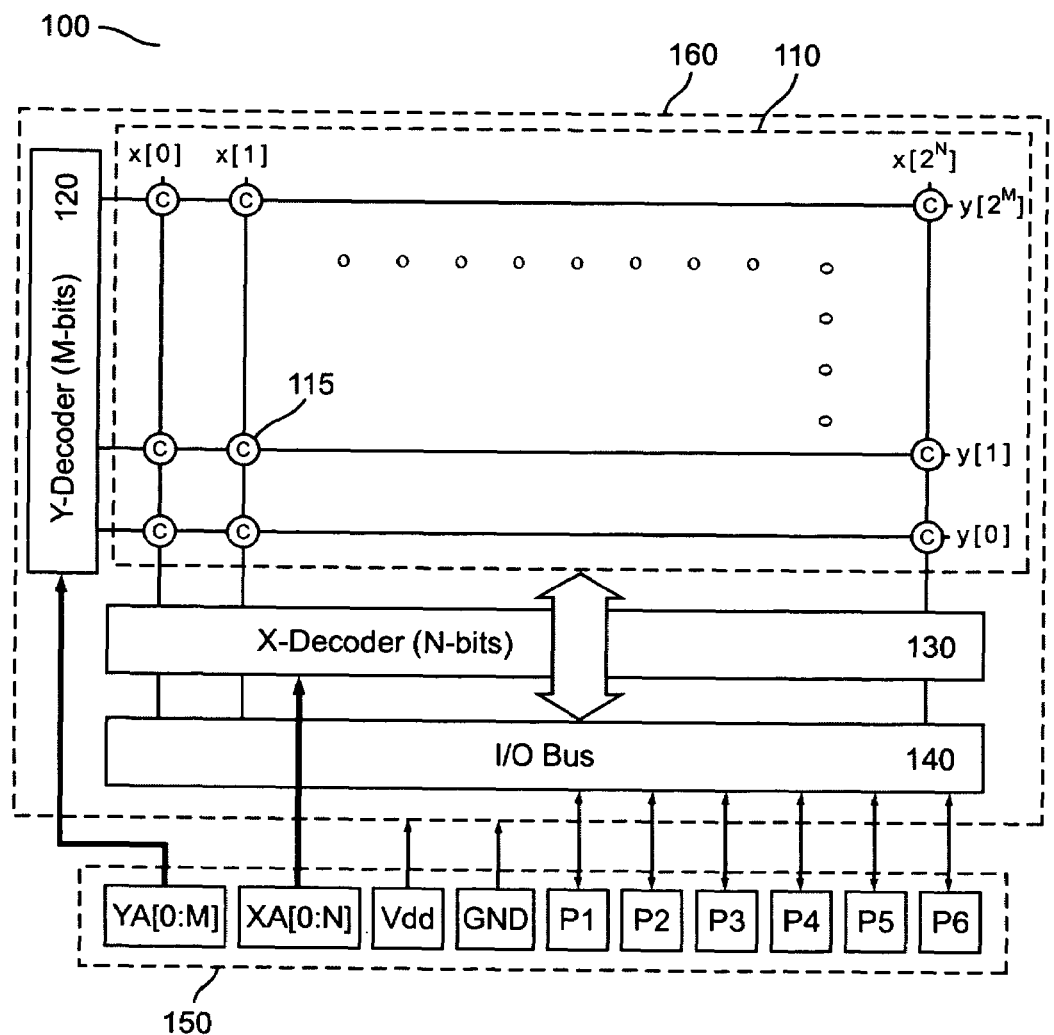
FIG. 1 is a block diagram illustrating a test structure array in accordance with one embodiment of the present invention.

FIG. 1 is a block diagram illustrating a test structure array 100 in accordance with one embodiment of the present invention. A core array 110 contains $2^M$ rows and $2^N$ columns of unit cells 115. Each unit cell 115 can have one device under test (DUT). So the total number of DUTs in the test structure array 100 can have is $2^M \times 2^N$.

Referring to FIG. 1, each individual unit cell 115 is addressable by M bits of Row-Decoder (X) 120 and N bits of Column-Decoder (Y) 130. For a given address, only one predetermined unit cell 115 is selected, and test signals are passed to a DUT in that particular cell 115.

Corresponding terminals of all the unit cells 115 in a column are connected through a corresponding bit-line, and then coupled to a bus-line in the I/O bus 140. As an example, there are six terminals in every unit cell 115, so every column contains six bit-lines, and the I/O bus 140 also has six bus-lines.

For a small size core array 110, the I/O bus 140 may simply be hard wires. But if the core array 110 is big, the loading of lumping one bit-line from every column will be considerably large and affect measurement accuracy. Then a multiplexed I/O bus 140 may be employed, and uses the column decoder to select only one column of terminals to be coupled to the I/O bus 140 for a given address.

Referring to FIG. 1, probe pads 150 are for test equipment to make contacts with test structure array 160 and hence any DUT placed inside the core array 110. XA[0:M] are M bits of column address pads, and YA[0:N] are N bits of row address pads. Vdd and GND are power supply pads, with a Vdd pad for a positive supply voltage and a GND pad for a complimentary lower supply voltage. P1~P6 pads are terminal pads for passing test signals between the test equipment and the DUTs.

Figure 2:
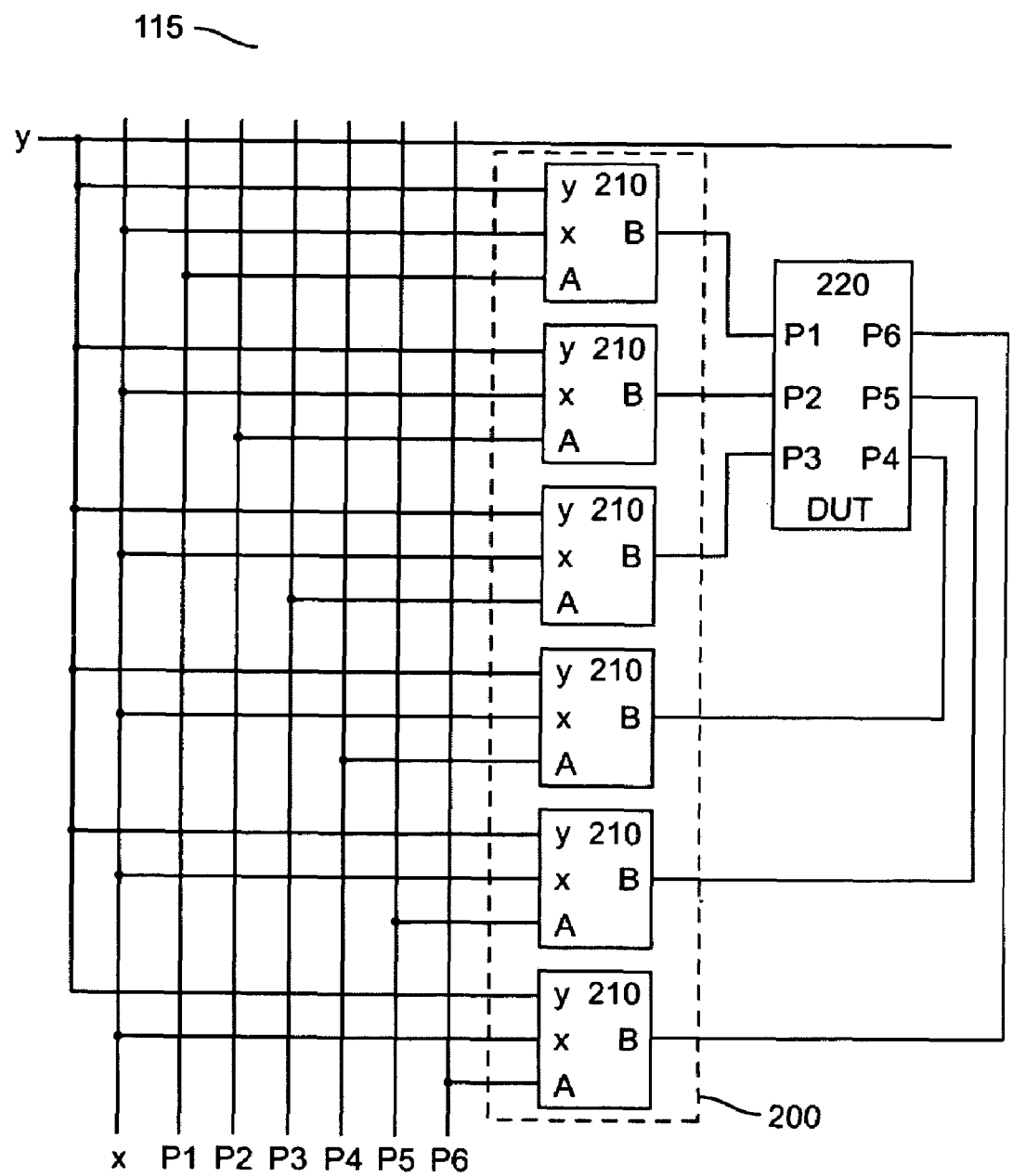
FIG. 2 schematically illustrates a unit cell of the test structure array.

FIG. 2 schematically illustrates a unit cell 115 of the test structure array 100. The unit cell comprises an access-control circuitry 200 and a device under test (DUT) 220. Inside the access-control circuitry 200, there are six identical controlled transmission gates (CTGs) 210, which are commonly controlled by two address pins x and y, i.e., these CTGs are on and off at the same time. Since one CTG 210 controls one pin for a device under test, so that a total of six pins, P1~P6, can be coupled to a DUT 220.

In order to simplify designs of the test structure arraying 100, all the unit cells 115 are isomorphic as shown in FIG. 2, according to one embodiment of the present invention, even though transistors in the CTGs 210 of the unit cells can have different sizes from one unit cell 115 to another.

Figure 3A:
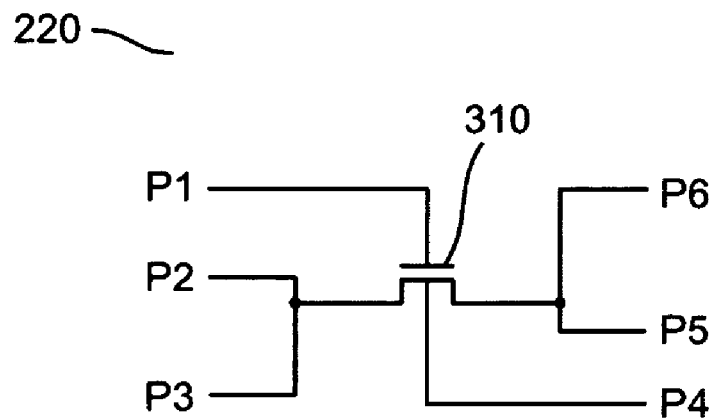
FIGS. 3A~3C schematically illustrates connections of sample devices under test (DUT).
Figure 3B:
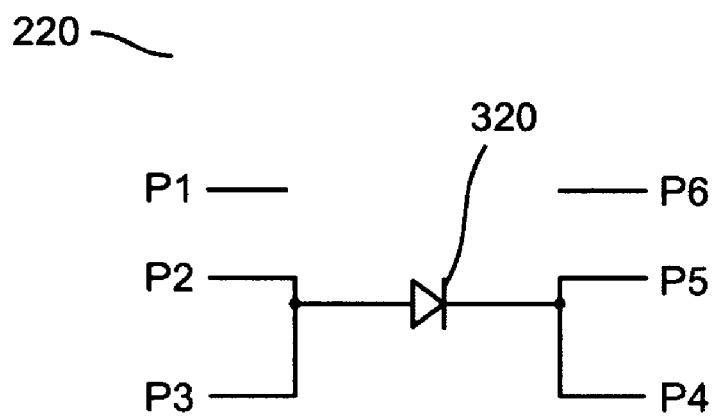
Figure 3C:
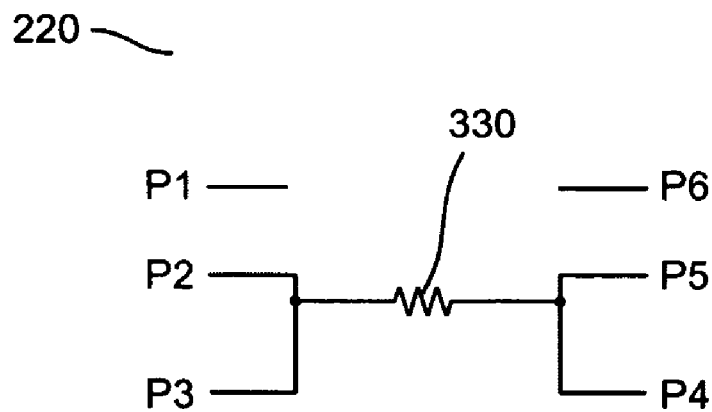

FIGS. 3A~3C schematically demonstrates three sample of DUTs 220. FIG. 3A shows a N-type metal-oxide-semiconductor (NMOS) transistor 310 under test. A pin P1 is connected to a gate of the NMOS transistor 310. Pins P2 and P3 are connected to a source/drain of the NMOS transistor 310. A pin P4 is connected to a bulk of the NMOS transistor 310. Pins P5 and P6 are connected to another source/drain of the NMOS transistor 310. Note that both the source and the drain are connected to two pins, so that Kelvin sensing can be applied to the NMOS transistor 310 to reduce negative effects created by resistances of the bit-lines and bus-lines.

FIG. 3B shows a diode 320 under test. Two pins, P1 and P6 are not used. Pins P2 and P3 are connected to an anode of the diode 320. Pins P4 and P5 are connected to a cathode of the diode 320. Note that both the anode and the cathode are connected to two pins, so that Kelvin sensing can be applied to the diode 320 to reduce negative effects created by resistances of the bit-lines and bus-lines.

FIG. 3C shows a resistor 330 under test. Two pins, P1 and P6 are not used. Pins P2 and P3 are connected to a terminal of the resistor 330. Pins P4 and P5 are connected to another terminal of the resistor 330. Again there are four pins connected to the resistor 330, so that Kelvin sensing can be applied to the resistor 330 to reduce negative effects created by resistances of the bit-lines and bus-lines.

Figure 4A:
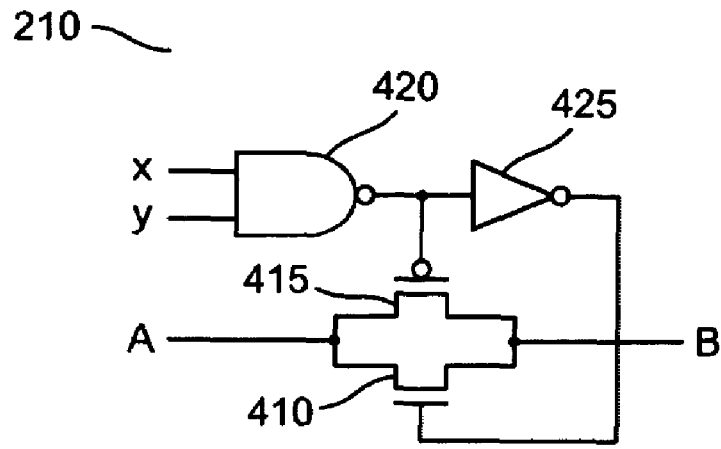
FIGS. 4A~4C schematically illustrate three examples of a controlled transmission gate (CTG) used in unit cells of the test structure array.
Figure 4B:
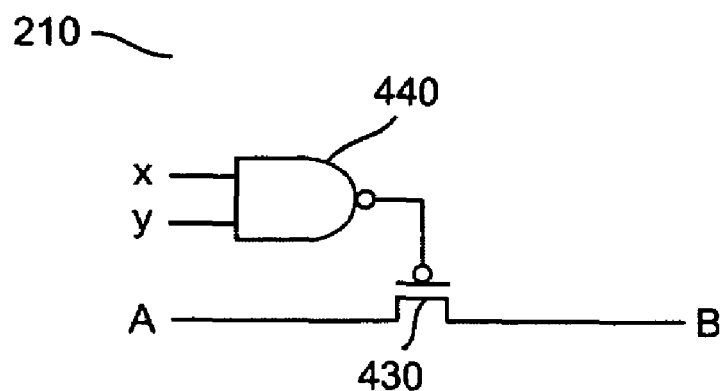
Figure 4C:
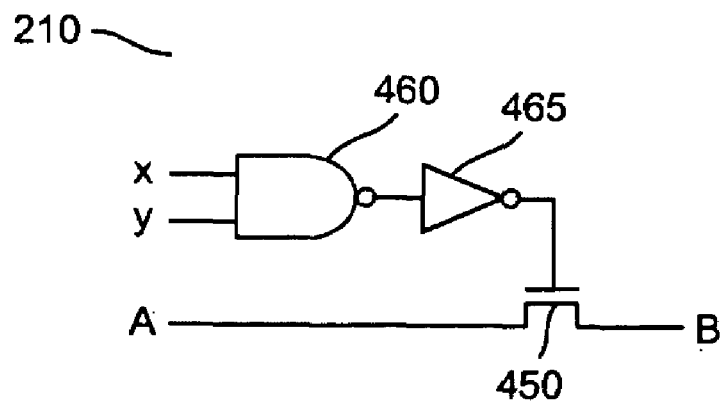

FIGS. 4A~4C schematically illustrate three examples of CTG 210. FIG. 4A shows a CTG 210 having both a NMOS transistor 410 and a P-type MOS or PMOS transistor 415 as a transmission gate. A NAND gate 420 and an inverter 425 form an address decoder. When input pins x and y of the NAND gate are both 'high', the NMOS transistor 410 and the PMOS transistor 415 are both turned on to allow a signal or a voltage to pass the CTG 210.

FIG. 4B shows a CTG 210 having only a PMOS transistor 430 as a transmission gate. Comparing to the CTG 210 shown in FIG. 4A, an advantage of this type of CTG 210 is that it has less devices and hence occupies a smaller area. But a disadvantage of this type of CTG 210 is that it does not conduct low voltage signals as well.

FIG. 4C shows a CTG 210 also having only one transmission transistor, a NMOS transistor 450. Comparing to the CTG 210 shown in FIG. 4A, an advantage of this type of CTG 210 is that it has less devices and hence occupies a smaller area. But a disadvantage of this type of CTG 210 is that it does not conduct high voltage signals as well, contrary to the CTG 210 shown in FIG. 4B.

One issue when using CTGs to switch among plurality of DUTs is that the transmission gate transistors of a CTG must operate at linear region to maintain accuracy of measurements. If the transmission gate transistors operate at a saturation region, a current supplied to a DUT will be limited by the transmission gate transistors, i.e., an increase of voltage across the DUT will not result in an increase of current flowing through the DUT, so that an accurate measurement can not be achieved.

Figure 5:
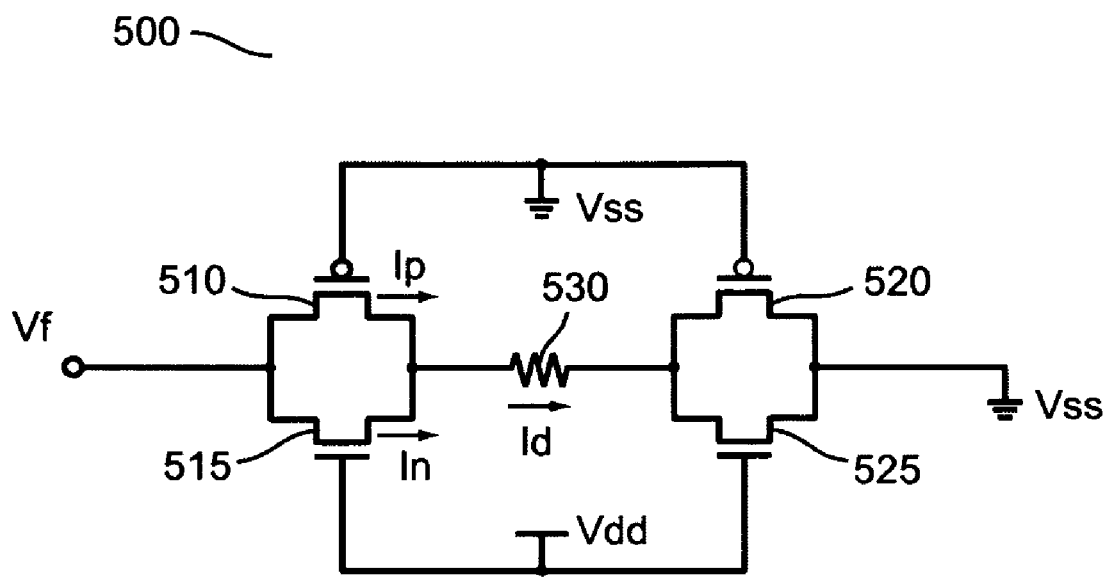
FIG. 5 schematically illustrates a resistor under test as an example for optimizing transistor sizes in transmission gates.

FIG. 5 schematically illustrates a resistor under test as an example for optimizing transistor sizes in transmission gates. Here PMOS transistors 510 and 520 are identical, so are NMOS transistors 515 and 525. For the PMOS transistor 510, Ip represents source-drain current. For the NMOS transistor 515, In represents source-drain current, Vdsn represents a source-drain voltage, Vgsn represents gate-source voltage and Vtn represents a threshold voltage. For a resistor 530, Rd represents its resistance, Id represents its current, and Vd represents its voltage across the resistor 530. Then the current Id can be expressed as:

$$Id = In + Ip, \text{ if } In = Ip, \text{ then } Id = 2 \cdot In \qquad \text{Eq. 1}$$

In linear region for the NMOS transistor 515 with a channel width Wn and a channel length Ln, $$In = \mu_n C_{ox} \frac{Wn}{Ln}\left[(Vgsn - Vtn) \cdot Vdsn - \frac{Vdsn^2}{2}\right] \qquad \text{Eq. 2}$$

A voltage across the resistor 530 can be expressed as:

$$Vf = 2 \cdot Vdsn + Vd \qquad \text{Eq. 3}$$

$$Vdsn = \frac{Vf - Vd}{2} \qquad \text{Eq. 4}$$

$$Vd = Vf - 2 \cdot Vdsn \qquad \text{Eq. 5}$$

Substituting Eqs. 1 and 2 into Eqs. 3, 4 and 5, then a channel width and length ratio of the transmission gate transistor 515 becomes:

$$\frac{Wn}{Ln} = \frac{Vd}{2 \cdot Rd \cdot \mu_n C_{ox}\left[(Vf - Vtn) \cdot \frac{Vf - Vd}{2} - \frac{(Vf - Vd)^2}{8}\right]} \qquad \text{Eq. 6}$$

In a typical operation, Vf, Rd and Vd is predetermined and the rest of the parameters are constant for a given process, so the (Wn/Ln) ratio can be determined from the Eq. 6. Then the (Wp/Lp) ratio for PMOS transistor 510 can be determined from (Wn/Ln) to make In=Ip.

Further increasing the (Wn/Ln) and (Wp/Lp) ratios obtained from the Eq. 6, can give more guard band to ensure the transmission gate transistors always operate in the linear region.

With this invention, various types of devices under test can be placed in the unit cells of the test structure array. All the unit cells are isomorphic, i.e., they all have six CTGs. But sizes of the transmission gate transistors inside a CTG are configured to fit for a device under test being placed in that unit cell to make sure that the transmission gate transistors operate always in the linear region. With addressable unit cells array and multiplexing CTGs, a small number of probe pads can test a relatively large number of devices.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor test structure array comprising:
   a plurality of unit cells containing devices under test (DUTs) arranged in an addressable array, each device under test including a plurality of pins for receiving test signals; and
   an access-control circuitry within each unit cell for controlling accesses to the one or more DUTs,
   wherein the access-control circuitry comprises at least two identical controlled transmission gates (CTGs), each CTG being turned on simultaneously to pass the test signals to a given device under test and a plurality of the access-control circuitries are isomorphic.

2. The semiconductor test structure array of claim 1, wherein at least one CTG further comprises one or more NMOS transistors and one or more PMOS transistors connected as a transmission gate.

3. The semiconductor test structure array of claim 2, wherein the NMOS and the PMOS transistors have predetermined channel width-over-length ratios to ensure both the NMOS and the PMOS transistors operate in linear regions for a given device under test.

4. The semiconductor test structure array of claim 1, wherein at least one CTG further comprises one or more NMOS transistors connected as a transmission gate.

5. The semiconductor test structure array of claim 4, wherein the NMOS transistors have predetermined channel width-over-length ratios to ensure the NMOS transistors operate in linear regions for a given device under test.

6. The semiconductor test structure array of claim 1, wherein at least one CTG further comprises one or more PMOS transistors connected as a transmission gate.

7. The semiconductor test structure array of claim 6, wherein the PMOS transistors have predetermined channel width-over-length ratios to ensure the PMOS transistors operate in linear regions for a given device under test.

8. The semiconductor test structure array of claim 1 further comprising a row decoder and a column decoder for addressing the unit cells.

9. The semiconductor test structure array of claim 1, wherein the number of CTGs in an access-control circuitry is at least four.

10. The semiconductor test structure array of claim 1, wherein each access-control circuitry further comprises one or more address pins to simultaneously control the CTGs contained therein.

11. The semiconductor test structure array of claim 1, wherein the corresponding CTGs in a plurality of unit cells of a row are coupled to a row data-line.

12. The semiconductor test structure array of claim 1, wherein the corresponding CTGs in a plurality of unit cells of a column are coupled to a column data-line.

13. A semiconductor test structure array comprising:
   a plurality of unit cells containing devices under test (DUTs) arranged in an addressable array, each device under test including a plurality of pins for receiving test signals; and
   an access-control circuitry within each unit cell for controlling accesses to the one or more DUTs,
   wherein the access-control circuitries are isomorphic and each access-control circuitry comprises at least two identical controlled transmission gates (CTGs), and each CTG being turned on simultaneously to pass the test signals to a given device under test, and
   wherein at least one of the CTGs further comprises one or more NMOS transistors and one or more PMOS transistors connected as a transmission gate, wherein the NMOS and the PMOS transistors have predetermined channel width-over-length ratios to ensure both the NMOS and the PMOS transistors operate in linear regions for a given device under test.

14. The semiconductor test structure array of claim 13 further comprising a row decoder and a column decoder for addressing the unit cells.

15. The semiconductor test structure array of claim 13, wherein the number of CTGs in an access-control circuitry is at least four.

16. The semiconductor test structure array of claim 13, wherein the each access-control circuitry further comprises one or more address pins to simultaneously control the CTGs contained therein.

17. The semiconductor test structure array of claim 13, wherein the corresponding CTGs in a plurality of unit cells of a row are coupled to a row data-line.

18. The semiconductor test structure array of claim 13, wherein the corresponding CTGs in a plurality of unit cells of a column are coupled to a column data-line.

19. A semiconductor test structure array comprising:
   a row decoder;
   a column decoder;
   a plurality of unit cells containing devices under test (DUTs) arranged in an addressable array, each device under test including a plurality of pins for receiving test signals; and
   an access-control circuitry within each unit cell for controlling accesses to the one or more DUTs,
   wherein the access-control circuitries are isomorphic and each access-control circuitry comprises at least two identical controlled transmission gates (CTGs), each CTG being turned on simultaneously to pass the test signals to a given device under test, and
   wherein the CTG further comprises one or more NMOS transistors and one or more PMOS transistors connected as a transmission gate, wherein the NMOS and the PMOS transistors have predetermined channel width-over-length ratios to ensure both the NMOS and the PMOS transistors operate in linear regions for a given device under test.

20. The semiconductor test structure array of claim 19, wherein each access-control circuitry farther comprises one or more address pins to simultaneously control the CTGs contained therein.

* * * * *